(12) United States Patent
Zhao et al.

(10) Patent No.: US 12,386,227 B2
(45) Date of Patent: Aug. 12, 2025

(54) DISPLAY PANEL AND MANUFACTURING METHOD THEREOF, AND ELECTRONIC DEVICE

(71) Applicant: GUANGZHOU CHINA STAR OPTOELECTRONICS SEMICONDUCTOR DISPLAY TECHNOLOGY CO., LTD., Guangzhou (CN)

(72) Inventors: Bichan Zhao, Guangzhou (CN); Fen Long, Guangzhou (CN)

(73) Assignee: GUANGZHOU CHINA STAR OPTOELECTRONICS SEMICONDUCTOR DISPLAY TECHNOLOGY CO., LTD., Guangzhou (CN)

( * ) Notice: Subject to any disclaimer, the term of this patent is extended or adjusted under 35 U.S.C. 154(b) by 0 days.

(21) Appl. No.: 18/271,978

(22) PCT Filed: May 16, 2023

(86) PCT No.: PCT/CN2023/094528
§ 371 (c)(1),
(2) Date: Jul. 12, 2023

(87) PCT Pub. No.: WO2024/221501
PCT Pub. Date: Oct. 31, 2024

(65) Prior Publication Data
US 2024/0361652 A1    Oct. 31, 2024

(30) Foreign Application Priority Data
Apr. 25, 2023    (CN) .......................... 202310456914.8

(51) Int. Cl.
*G02F 1/1362*    (2006.01)
*G02F 1/1333*    (2006.01)
(Continued)

(52) U.S. Cl.
CPC .. *G02F 1/136218* (2021.01); *G02F 1/133345* (2013.01); *G02F 1/134363* (2013.01);
(Continued)

(58) Field of Classification Search
CPC ......... G02F 1/134363; G02F 1/133345; H01L 27/1237; H01L 27/1248
See application file for complete search history.

(56) References Cited

U.S. PATENT DOCUMENTS

2015/0153600 A1*    6/2015    Won ...................... H01L 27/127
                                                                 438/158

FOREIGN PATENT DOCUMENTS

CN    104465675 A    3/2015
CN    107272279 A    10/2017
(Continued)

OTHER PUBLICATIONS

PCT International Search Report for International Application No. PCT/CN2023/094528, mailed on Jan. 24, 2024, 10pp.
(Continued)

*Primary Examiner* — Paisley L Wilson
(74) *Attorney, Agent, or Firm* — The Roy Gross Law Firm, LLC; Roy D. Gross

(57) ABSTRACT

The present application provides a display panel and a manufacturing method thereof, and an electronic device. The display panel includes a light-transmitting region and a light-shielding region disposed at a periphery of the light-transmitting region. A thickness of a passivation layer of the display panel in the light-transmitting region is less than a thickness of the passivation layer in the light-shielding region, so as to reduce a thickness of an insulating layer between a pixel electrode and a common electrode. In this way, when a certain electric field is formed, a driving voltage which is required can be reduced, so as to reduce power (Continued)

consumption of the display panel, thereby alleviating an urgent need to reduce power consumption of display screen in prior art.

15 Claims, 5 Drawing Sheets

(51) Int. Cl.
    *G02F 1/1343*     (2006.01)
    *H10D 86/40*     (2025.01)
    *H10D 86/60*     (2025.01)

(52) U.S. Cl.
    CPC .. *G02F 1/136209* (2013.01); *G02F 1/136222* (2021.01); *G02F 1/13629* (2021.01); *G02F 1/136295* (2021.01); *H10D 86/441* (2025.01); *H10D 86/60* (2025.01)

(56) References Cited

FOREIGN PATENT DOCUMENTS

| | | |
|---|---|---|
| CN | 108459445 A | 8/2018 |
| CN | 109407388 A | 3/2019 |
| CN | 110412805 A | 11/2019 |
| CN | 111679496 A | 9/2020 |
| CN | 115390302 A | 11/2022 |

OTHER PUBLICATIONS

PCT Written Opinion of the International Searching Authority for International Application No. PCT/CN2023/094528, mailed on Jan. 24, 2024, 8pp.

\* cited by examiner

DISPLAY PANEL AND MANUFACTURING METHOD THEREOF, AND ELECTRONIC DEVICE

CROSS REFERENCE TO RELATED APPLICATIONS

This application claims the benefits of International Application No. PCT/CN2023/094528, filed May 16, 2023, which claims priority to Chinese Application No. 202310456914.8, filed on Apr. 25, 2023. The entire disclosures of each of the applications are incorporated herein by reference.

TECHNICAL FIELD

The present application relates to the field of display technologies, and especially relates to a display panel and a manufacturing method thereof, and an electronic device.

BACKGROUND

With development of display technologies, momentum of smart mobile devices such as flat panel displays, etc. is becoming more and more obvious, the smart mobile devices are increasingly applied to production and daily life due to characteristics such as lightness, etc. However, in a case that development of battery technologies is slow, as display screens are components of which power consumption is highest, power consumption of the display screens determines a standby time of mobile devices, etc. to a large extent. For this, a reduction of power consumption has become a consistent goal in the industry in order to make the mobile devices more power-saving and have a longer standby time. Therefore, a reduction of power consumption of the display screens has become an urgent problem to be solved in the industry.

SUMMARY

The present application provides a display panel and a manufacturing method thereof, and an electronic device, so as to alleviate a technical problem that power consumption of display screens in prior art is urgently needed to be reduced.

TECHNICAL SOLUTIONS

In order to solve above problems, technical solutions provided by the present application are as follows:

The present application provides a display panel including a light-transmitting region and a light-shielding region disposed at a periphery of the light-transmitting region, and further including:
 a first substrate;
 a first electrode layer disposed on the first substrate and including a pixel electrode formed in the light-transmitting region;
 a gate insulating layer covering the first electrode layer and the first substrate;
 a source-drain electrode layer disposed on the gate insulating layer and including a data line formed in the light-shielding region;
 a passivation layer covering the source-drain electrode layer and the gate insulating layer; and
 a second electrode layer disposed on the passivation layer and including a light-shielding electrode formed in the light-shielding region and a common electrode formed in the light-transmitting region, the light-shielding electrode being disposed corresponding to the data line, and the common electrode being disposed corresponding to the pixel electrode;
 wherein a thickness of the passivation layer in the light-transmitting region is less than a thickness of the passivation layer in the light-shielding region.

In the display panel provided by an embodiment of the present application, the passivation layer is provided with a first opening corresponding to the light-transmitting region, the first opening at least goes through the passivation layer to expose the gate insulating layer, and the common electrode is disposed in the first opening and disposed on the gate insulating layer.

In the display panel provided by an embodiment of the present application, the first opening further extends into the gate insulating layer, and a thickness of the gate insulating layer in the light-transmitting region is less than a thickness of the gate insulating layer in the light-shielding region.

In the display panel provided by an embodiment of the present application, an orthographic projection of the light-shielding electrode on the first substrate covers an orthographic projection of the data line on the first substrate.

In the display panel provided by an embodiment of the present application, the light-shielding electrode is electrically connected to the common electrode.

In the display panel provided by an embodiment of the present application, the display panel further includes a gate metal layer disposed between the first electrode layer and the source-drain electrode layer; the gate metal layer includes a gate scanning line formed in the light-shielding region, and the first electrode layer further includes a first conductive part formed in the light-shielding region and covering the gate scanning line.

In the display panel provided by an embodiment of the present application, the display panel further includes a semiconductor layer disposed on the gate insulating layer; the source-drain electrode layer is covered on the semiconductor layer, the semiconductor layer includes a first semiconductor part formed in the light-shielding region, and the data line covers the first semiconductor part.

In the display panel provided by an embodiment of the present application, the gate scanning line extends along a first direction, the data line extends along a second direction, the gate scanning line and the data line adjacent to each other define the light-transmitting region, and the first direction differs from the second direction.

In the display panel provided by an embodiment of the present application, the display panel further includes a light-shielding layer and a color filter layer disposed on a side of the second electrode layer away from the first substrate, the light-shielding layer is provided with a second opening corresponding to the light-transmitting region, and the color filter layer is disposed in the second opening.

The present application further provides a manufacturing method of a display panel, including:
 providing a first substrate defined with a light-transmitting region and a light-shielding region disposed at a periphery of the light-transmitting region;
 forming a first electrode layer disposed on the first substrate, the first electrode layer includes a pixel electrode formed in the light-transmitting region;
 covering the first electrode layer and the first substrate with a gate insulating layer;

forming a source-drain electrode layer disposed on the gate insulating layer, the source-drain electrode layer includes a data line formed in the light-shielding region;

covering the source-drain electrode layer and the gate insulating layer with a passivation layer, a thickness of the passivation layer in the light-transmitting region is less than a thickness of the passivation layer in the light-shielding region; and forming a second electrode layer disposed on the passivation layer, the second electrode layer includes a light-shielding electrode formed in the light-shielding region and a common electrode formed in the light-transmitting region; the light-shielding electrode is disposed corresponding to the data line, and the common electrode is disposed corresponding to the pixel electrode.

In the manufacturing method of the display panel provided by an embodiment of the present application, the step of covering the source-drain electrode layer and the gate insulating layer with the passivation layer, and the thickness of the passivation layer in the light-transmitting region is less than the thickness of the passivation layer in the light-shielding region includes:

depositing a passivation layer on the source-drain electrode layer and the gate insulating layer, and carrying out a photoresist process for the passivation layer to form a first opening in the passivation layer in the light-transmitting region; the first opening goes through at least a portion of the passivation layer, so that the thickness of the passivation layer in the light-transmitting region is less than the thickness of the passivation layer in the light-shielding region.

The present application further provides an electronic device including a house and a display panel disposed in the house, the display panel includes a light-transmitting region and a light-shielding region disposed at a periphery of the light-transmitting region, and the display panel further includes:

a first substrate;

a first electrode layer disposed on the first substrate and including a pixel electrode formed in the light-transmitting region;

a gate insulating layer covering the first electrode layer and the first substrate;

a source-drain electrode layer disposed on the gate insulating layer and including a data line formed in the light-shielding region;

a passivation layer covering the source-drain electrode layer and the gate insulating layer; and a second electrode layer disposed on the passivation layer and including a light-shielding electrode formed in the light-shielding region and a common electrode formed in the light-transmitting region, the light-shielding electrode is disposed corresponding to the data line, and the common electrode is disposed corresponding to the pixel electrode;

a thickness of the passivation layer in the light-transmitting region is less than a thickness of the passivation layer in the light-shielding region.

In the electronic device provided by an embodiment of the present application, the passivation layer is provided with a first opening corresponding to the light-transmitting region, the first opening at least goes through the passivation layer to expose the gate insulating layer, and the common electrode is disposed in the first opening and disposed on the gate insulating layer.

In the electronic device provided by an embodiment of the present application, the first opening further extends into the gate insulating layer, and a thickness of the gate insulating layer in the light-transmitting region is less than a thickness of the gate insulating layer in the light-shielding region.

In the electronic device provided by an embodiment of the present application, an orthographic projection of the light-shielding electrode on the first substrate covers an orthographic projection of the data line on the first substrate.

In the electronic device provided by an embodiment of the present application, the light-shielding electrode is electrically connected to the common electrode.

In the electronic device provided by an embodiment of the present application, the display panel further includes a gate metal layer disposed between the first electrode layer and the source-drain electrode layer, the gate metal layer includes a gate scanning line formed in the light-shielding region, and the first electrode layer further includes a first conductive part formed in the light-shielding region and covering the gate scanning line.

In the electronic device provided by an embodiment of the present application, the display panel further includes a semiconductor layer disposed on the gate insulating layer; the source-drain electrode layer is covered on the semiconductor layer, the semiconductor layer includes a first semiconductor part formed in the light-shielding region, and the data line covers the first semiconductor part.

In the electronic device provided by an embodiment of the present application, the gate scanning line extends along a first direction, the data line extends along a second direction, the gate scanning line and the data line adjacent to each other define the light-transmitting region, and the first direction differs from the second direction.

In the electronic device provided by an embodiment of the present application, the display panel further includes a light-shielding layer and a color filter layer disposed on a side of the second electrode layer away from the first substrate, the light-shielding layer is provided with a second opening corresponding to the light-transmitting region, and the color filter layer is disposed in the second opening.

BENEFICIAL EFFECTS

In the display panel and the manufacturing method thereof, and the electronic device provided by the present application, the display panel includes the light-transmitting region and the light-shielding region disposed at the periphery of the light-transmitting region. The first electrode layer of the display panel is disposed on the first substrate, and includes a pixel electrode formed in the light-transmitting region. The gate insulating layer covers the first electrode layer and the first substrate. The source-drain electrode layer is disposed on the gate insulating layer, and includes the data line formed in the light-shielding region. The passivation layer covers the source-drain electrode layer and the gate insulating layer. The second electrode layer is disposed on the passivation layer, and includes the light-shielding electrode formed in the light-shielding region and the common electrode formed in the light-transmitting region. The light-shielding electrode is disposed corresponding to the data line, and the common electrode is disposed corresponding to the pixel electrode. The thickness of the passivation layer in the light-transmitting region is less than the thickness of the passivation layer in the light-shielding region, so as to reduce a thickness of an insulating layer between the pixel electrode and the common electrode. In this way, when a certain electric field is formed, a driving voltage which is required can be reduced, so as to reduce power consumption of the display panel, thereby alleviating an urgent need to reduce power consumption of display screen in prior art.

BRIEF DESCRIPTION OF THE DRAWINGS

In order to more clearly illustrate embodiments or the technical solutions of the present application, the accompanying figures of the present application required for illustrating embodiments or the technical solutions of the present application will be described in brief. Obviously, the accompanying figures described below are only part of the embodiments of the present application, from which those skilled in the art can derive further figures without making any inventive efforts.

DETAILED DESCRIPTION OF THE EMBODIMENT

Figure 1:
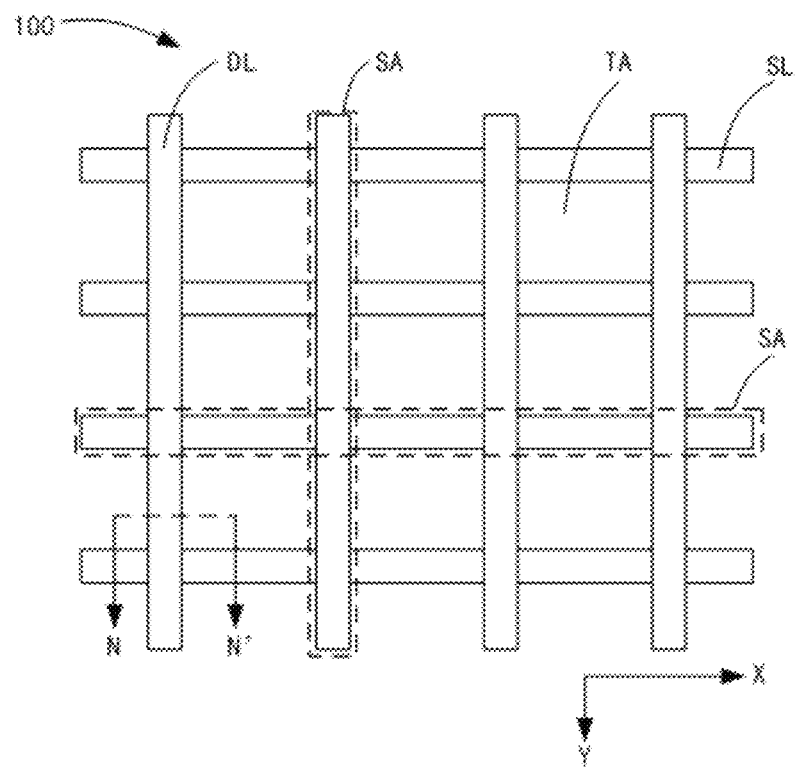
FIG. 1 is a top-viewed structural schematic diagram of a display panel provided by an embodiment of the present application.

The descriptions of embodiments below refer to accompanying drawings in order to illustrate certain embodiments which the present application can implement. The directional terms of which the present application mentions, for example, "top", "bottom", "upper", "lower", "front", "rear", "left", "right", "inside", "outside", "side", etc., only refer to directions of the accompanying figures. Therefore, the used directional terms are for illustrating and understanding the present application, but not for limiting the present application. In the figures, units with similar structures are indicated by the same reference numerals. In the drawings, the thicknesses of layers and regions are exaggerated for clarity. The dimensions and thickness of each component shown in the accompanying figures are arbitrarily shown, present application is not limited thereto.

For a problem of how to reduce power consumption of display screens, inventors of the present application found in researches that, two insulating layers which include a gate insulating layer and a passivation layer are disposed between a pixel electrode and a common electrode of a display screen, and a thickness of the insulating layers is large. Thus, a large driving voltage is required by the display screen, and power consumption of the display screen is large. For this, the present application provides a display panel and a manufacturing method thereof, and an electronic device to solve a problem of high power consumption of the display screen.

Figure 2:
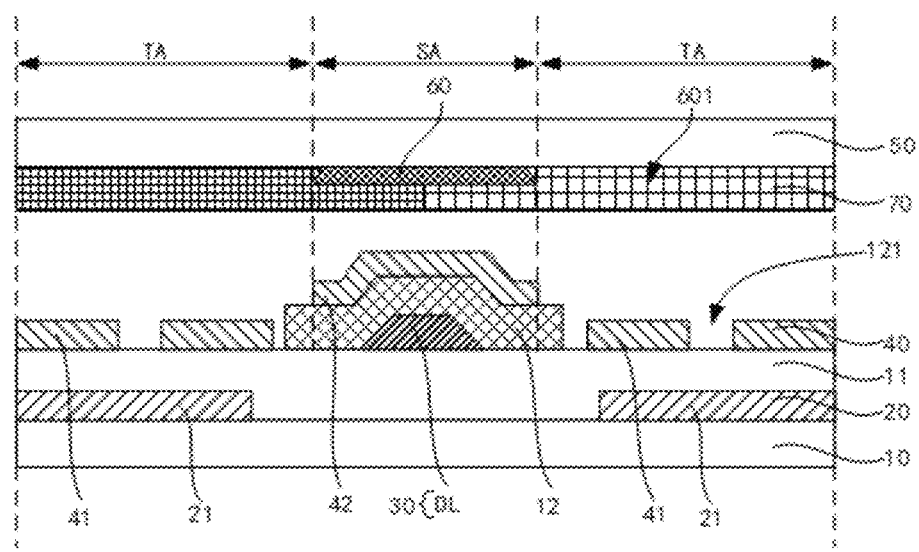
FIG. 2 is a cross-sectional structural schematic diagram along N-N' direction in FIG. 1.

Please refer to FIG. 1 to FIG. 2, FIG. 1 is a top-viewed structural schematic diagram of a display panel provided by an embodiment of the present application, and FIG. 2 is a cross-sectional structural schematic diagram along N-N' direction in FIG. 1. As shown in FIG. 1, a display panel 100 includes a light-transmitting region TA and a light-shielding region SA disposed at a periphery of the light-transmitting region TA. The display panel 100 further includes a plurality of gate scanning lines SL extending along a first direction X and a plurality of data lines DL extending along a second direction Y. The gate scanning lines SL and the data lines DL are both disposed corresponding to the light-shielding region SA, and the gate scanning line SL and the data line DL adjacent to each other define the light-transmitting region TA. The first direction X differs from the second direction Y, for example, the first direction X is a horizontal direction, the second direction Y is a vertical direction, and the first direction X and the second direction Y are perpendicular to each other.

Specifically, referring to FIG. 2, the display panel 100 further includes a first substrate 10 and a first electrode layer 20, a gate insulating layer 11, a source-drain electrode layer 30, a passivation layer 12, and a second electrode layer 40 which are sequentially disposed on the first substrate 10. Optionally, the first substrate 10 includes a glass substrate, etc.

The first electrode layer 20 is disposed on the first substrate 10, and the first electrode layer 20 includes a pixel electrode 21 formed in the light-transmitting region TA. Optionally, a material of the first electrode layer 20 includes a transparent conductive material such as indium tin oxide (ITO), etc.

The gate insulating layer 11 covers the first electrode layer 20 and the first substrate 10. A material of the gate insulating layer 11 includes an inorganic material such as silicon oxide (SiOx), silicon nitride (SiNx), and silicon oxynitride (SiNO), etc.

The source-drain electrode layer 30 is disposed on the gate insulating layer 11, and includes the data line DL formed in the light-shielding region SA. Of course, the source-drain electrode layer 30 further includes a source electrode and a drain electrode of a thin film transistor, and some other signal wirings, etc. formed in the light-transmitting region TA. The passivation layer 12 covers the source-drain electrode layer 30 and the gate insulating layer 11. Optionally, a material of the passivation layer 12 includes an inorganic material such as silicon oxide, silicon nitride, and silicon oxynitride, etc. The second electrode layer 40 is disposed on the passivation layer 12, and includes a light-shielding electrode 42 formed in the light-shielding region SA and a common electrode 41 formed in the light-transmitting region TA. The light-shielding electrode 42 is disposed corresponding to the data line DL, and the common electrode 41 is disposed corresponding to the pixel electrode 21. Optionally, a material of the second electrode layer 40 is the same as the material of the first electrode layer 20.

Optionally, an orthographic projection of the light-shielding electrode 42 on the first substrate 10 covers an orthographic projection of the data line DL on the first substrate 10, so that the light-shielding electrode 42 can completely block the data line DL, thereby improving light leakage in an region corresponding to the data line DL. Further, in order to improve effect of light-shielding of the light-shielding electrode 42, the light-shielding electrode 42 may be electrically connected to the common electrode 41.

The display panel 100 further includes a second substrate 50, and a light-shielding layer 60 and a color film layer 70 which are disposed on the second substrate 50. The light-shielding layer 60 and the color film layer 70 are both disposed towards the second electrode layer 40. The light-shielding layer 60 is disposed corresponding to the light-shielding region SA, the light-shielding layer 60 is provided with a second opening 601 corresponding to the light-transmitting region TA, and the color film layer 70 is disposed in the second opening 601. In addition, since the light-shielding electrode 42 is disposed corresponding to light-shielding region SA, the light-shielding electrode 42 together with the light-shielding layer 60 play a role of shielding light. Thus, light leakage in the light-shielding region SA is improved, a width of the light-shielding layer 60 can be reduced, thereby improving aperture ratio of the display panel 100.

Optionally, a material of the second substrate 50 is the same as that of the first substrate 10. A material of the light-shielding layer 60 includes an opaque material such as a black matrix (BM). The color filter layer 70 includes a red color film, a blue color film and a green color film, and color films with different colors are disposed in different second openings 601. The color film layer 70 is used to make a light with a specific color emitted after lights pass through the color film layer 70, for example, a red light is emitted after lights passing through the red color film, a blue light is emitted after lights passing through the blue color film, and a green light is emitted after lights passing through the green color film.

Of course, the display panel 100 further includes a liquid crystal layer (not shown) disposed between the color filter layer 70 and the second electrode layer 40. An electric field is formed between the pixel electrode 21 and the common electrode 41 to control deflection of liquid crystal molecules in the liquid crystal layer, so as to modulate backlights from a backlight source, thereby realizing color display of the display panel 100. Specifically, the data line DL is used to receive a data voltage, and the gate scanning line is used to receive a scan signal, so as to control a thin film transistor correspondingly connected to the gate scanning line and the data line DL to be turned on or off. When the thin film transistor is turned on, the data voltage received by the data line DL to which the thin film transistor is correspondingly connected, is written into a correspondingly one of the pixel electrodes 21 through the thin film transistor which is turned on. At the same time, a corresponding one of the common electrodes 41 is loaded with a common voltage, the electric field for controlling the deflection of the liquid crystal molecules is formed between the pixel electrode 21 and the common electrode 41. In this way, the deflection of the liquid crystal molecules in a corresponding area is controlled to modulate lights from the backlight source, and the lights after modulated are emitted from the light transmission region TA provided with the color filter layer 70, so as to realize color display of the display panel 100.

Further, a thickness of the passivation layer 12 in the light-transmitting region TA is less than a thickness of the passivation layer 12 in the light-shielding region SA, so as to reduce a thickness of an insulating layer between the pixel electrode 21 and the common electrode 41. In this way, when a certain electric field is formed, driving voltages for driving the pixel electrode 21 and the common electrode 41 can be reduced, so as to reduce power consumption of the display panel 100, thereby alleviating an urgent need to reduce power consumption of display screen in prior art. At the same time, by reducing the thickness of the insulating layer between the pixel electrode 21 and the common electrode 41, a capacitance value of a storage capacitor between the pixel electrode 21 and the common electrode 41 can also be increased, which can effectively improve variable refresh rate of the display panel 100. In the light-shielding region SA, an insulating layer between the data line DL and the light-shielding electrode 42 is thicker, which can increase a distance between the data line DL and the light-shielding electrode 42 disposed above the data line DL. Thus, coupling effect between the data line DL and the light-shielding electrode 42 is reduced, which is beneficial to reduce a load of the data line DL.

In the following, how to realize that the thickness of the passivation layer 12 in the light-transmitting region TA is less than the thickness of the passivation layer 12 in the light-shielding region SA is specifically explained.

Specifically, continuing to refer to FIG. 2, the passivation layer 12 is provided with a first opening 121 corresponding to the light-transmitting region TA. The first opening 121 at least goes through the passivation layer 12 to expose the gate insulating layer 11, and the common electrode 41 is disposed in the first opening 121 and disposed on the gate insulating layer 11. Specifically, after forming a whole layer of the passivation layer 12 on the source-drain electrode layer 30 and the gate insulating layer 11, a photoresist process is carried out on the whole layer of the passivation layer with a half-tone mask (HM). Amount of light passing through the half-tone mask in the light-shielding region SA and the light-transmitting region TA is controlled to control exposure amount. Thus, the passivation layer 12 is formed with different thicknesses in the light-shielding region SA and the light-transmitting region TA. Wherein, the passivation layer 12 in the light transmission region TA can be completely removed, so that there is only the gate insulating layer 11 which is remained and disposed between the common electrode 41 and the pixel electrode 21.

Figure 3:
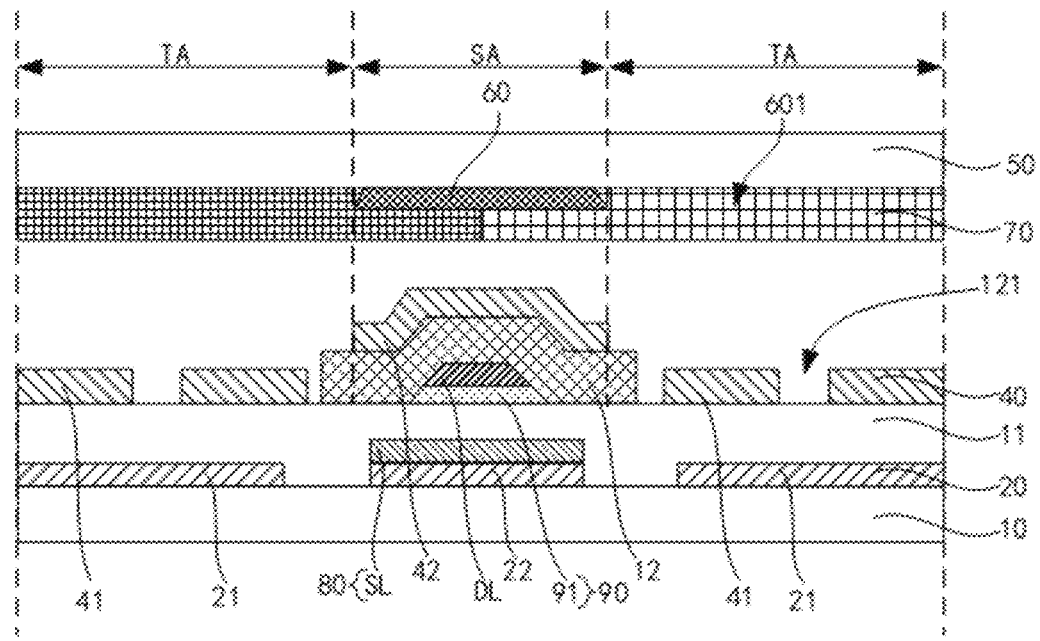
FIG. 3 is a cross-sectional structural schematic diagram of a display panel provided by an embodiment of the present application.

In one embodiment, referring to FIG. 1 to FIG. 3, FIG. 3 is a cross-sectional structural schematic diagram of a display panel provided by an embodiment of the present application. As shown in FIG. 3, the display panel 100 further includes a gate metal layer 80 disposed between the first electrode layer 20 and the source-drain electrode layer 30. The gate metal layer 80 includes a gate scanning line SL formed in the light-shielding region SA, and at the same time, the gate metal layer 80 further includes a gate of the thin film transistor and some other lines. The first electrode layer 20 further includes a first conductive part 22 formed in the light-shielding region SA, and the gate scanning line SL is covered on the first conductive part 22. In this way, the first electrode layer 20 and the gate metal layer 80 are patterned by a same photoresist process, so that one photomask is saved, thereby saving costs.

Further, the display panel 100 further includes a semiconductor layer 90. The semiconductor layer 90 is disposed on the gate insulating layer 11, the source-drain electrode layer 30 is covered on the semiconductor layer 90. The semiconductor layer 90 includes a first semiconductor part 91 formed in the light-shielding region SA and an active layer of the thin film transistor formed in the light transmission region TA. The data line DL is covered on the first semiconductor part 91. Similarly, the semiconductor layer 90 and the source-drain electrode layer 30 are also patterned by a same photoresist process, so that one photomask is saved, thereby saving costs.

Figure 4:
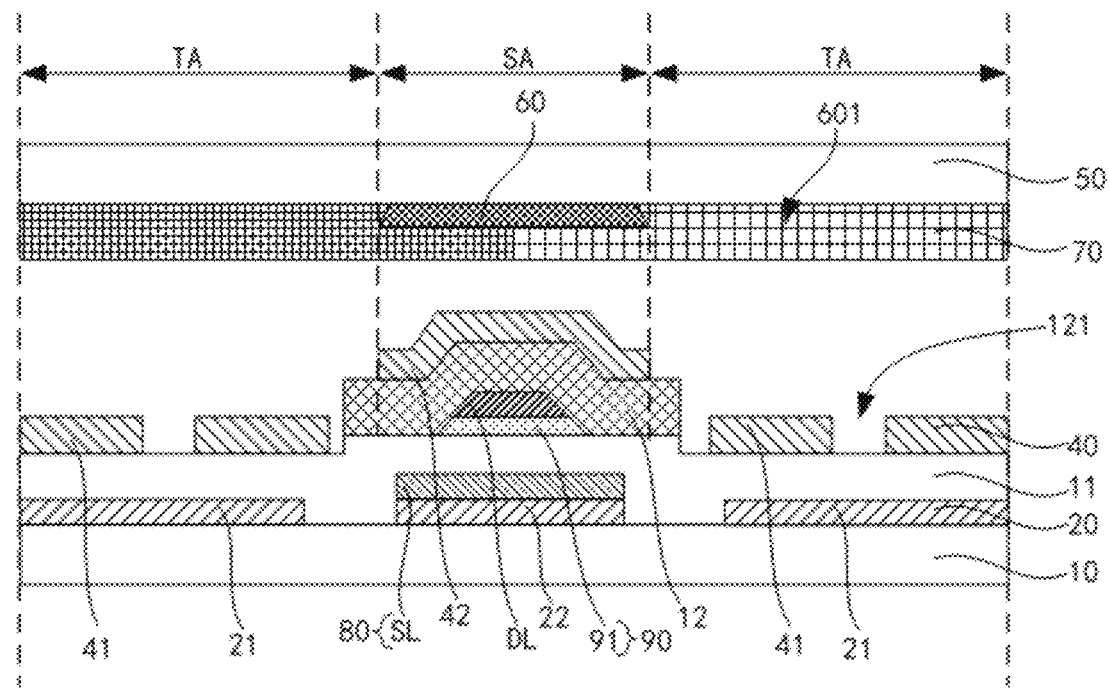
FIG. 4 is another cross-sectional structural schematic diagram of a display panel provided by an embodiment of the present application.

In one embodiment, please refer to FIG. 1 to FIG. 4. FIG. 4 is another cross-sectional structural schematic diagram of a display panel provided by an embodiment of the present application. A first opening 121 further extends into the gate insulating layer 11, and a thickness of the gate insulating layer 11 in the light-transmitting region TA is less than a thickness of the gate insulating layer 11 in the light-shielding region SA. Thus, the thickness of the insulating layer between the pixel electrode 21 and the common electrode 41 is further reduced, so as to further reduce driving voltages for driving the pixel electrode 21 and the common electrode 41, thereby reducing power consumption of the display panel 100.

Figure 5:
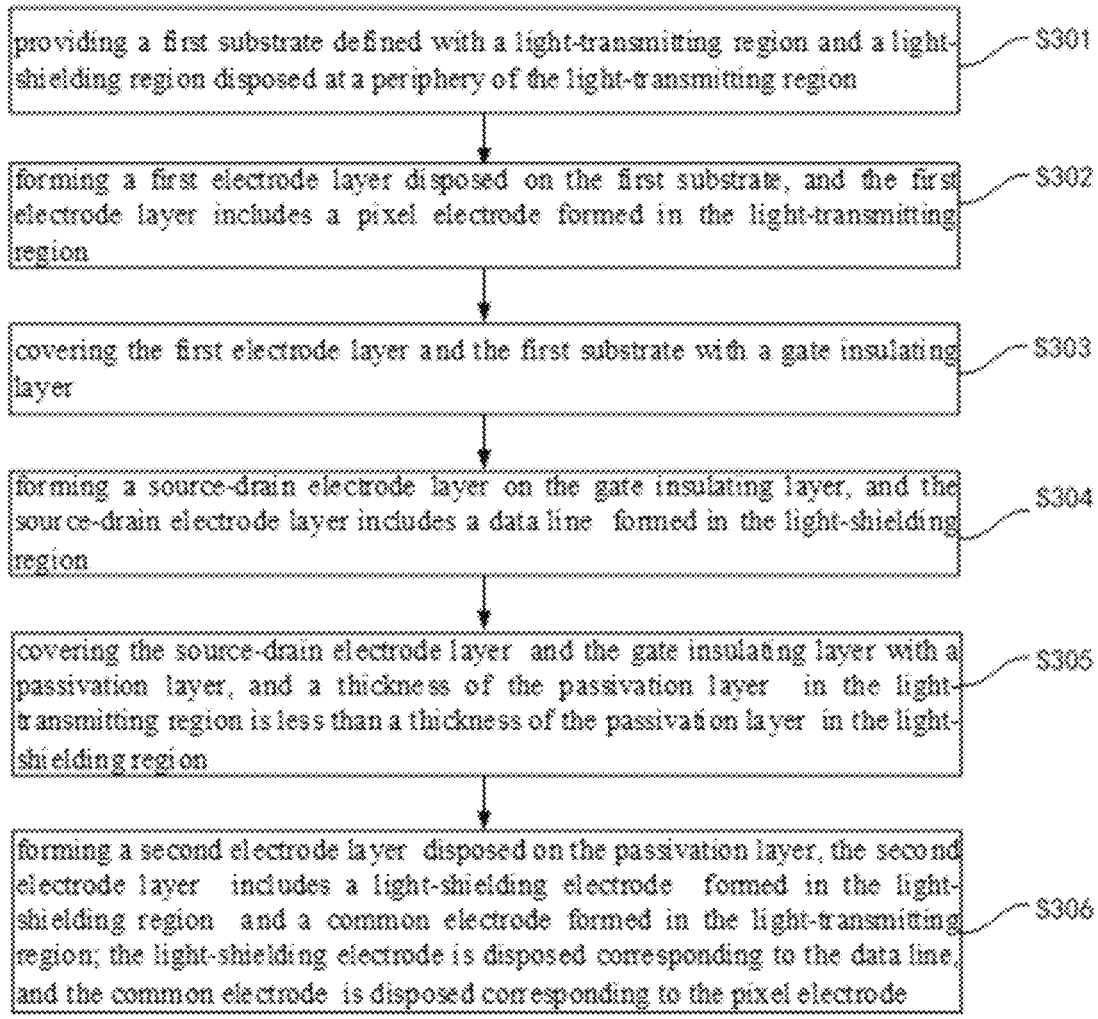
FIG. 5 is a flowchart of a manufacturing method of a display panel provided by an embodiment of the present application.
Figure 6:
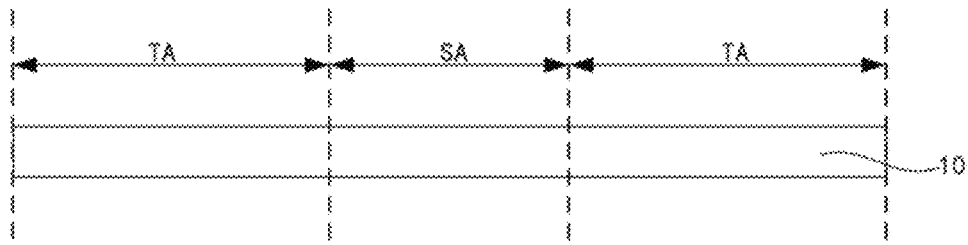
FIG. 6 to FIG. 14 are schematic diagrams of part film layer structures of the display panel manufactured by each step of the manufacturing method of the display panel provided by an embodiment of the present application.

Based on a same idea of invention, a manufacturing method of a display panel is provided by an embodiment of the present application further. Please refer to FIG. 1 to FIG. 14, FIG. 5 is a flowchart of a manufacturing method of a display panel provided by an embodiment of the present application, FIG. 6 to FIG. 14 are schematic diagrams of part film layer structures of the display panel manufactured by each step of the manufacturing method of the display panel provided by an embodiment of the present application. Referring to FIG. 5, a manufacturing method of a display panel includes following steps:

S301: providing a first substrate 10 defined with a light-transmitting region TA and a light-shielding region SA disposed at a periphery of the light-transmitting region TA;

Specifically, referring to FIG. 6, the first substrate 10 is provided, and processes such as cleaning and drying are performed on the first substrate 10. The first substrate 10 is defined with the light-transmitting region TA and the light-shielding region SA disposed at the periphery of the light-transmitting region TA. The first substrate 10 includes a hard substrate such as a glass substrate.

Figure 7:
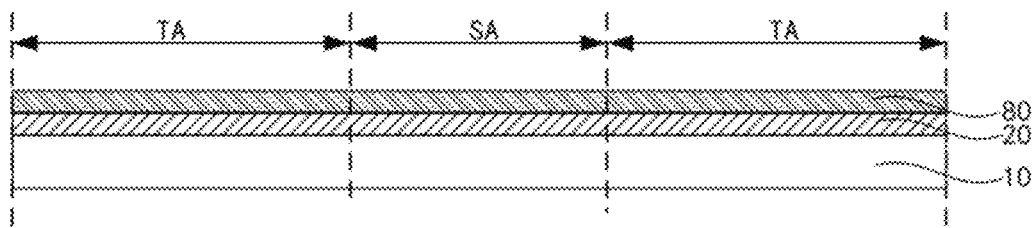
Figure 8:
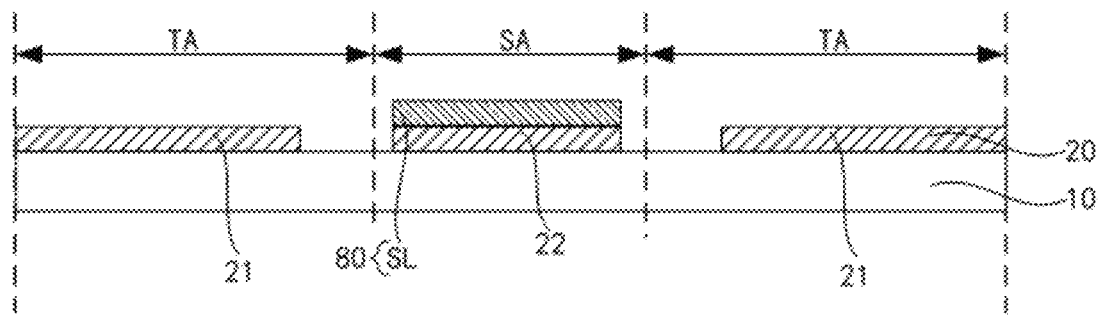

S302: forming a first electrode layer 20 disposed on the first substrate 10, and the first electrode layer 20 includes a pixel electrode 21 formed in the light-transmitting region TA;

Specifically, referring to FIG. 7 and FIG. 8. The first electrode layer 20 and the gate metal layer 80 are sequentially deposited on the first substrate 10, and a photoresist process is carried out on the first electrode layer 20 and the gate metal layer 80 with a first mask. Thus, the first electrode layer 20 includes the pixel electrode 21 formed in the light-transmitting region TA and a first conductive part 22 formed in the light-shielding region SA, and the gate metal layer 80 includes a gate scanning line SL formed in the light-shielding region SA. The gate scanning line SL is disposed corresponding to the first conductive part 22 and is covered on the first conductive part 22. Of course, the gate metal layer 80 further includes a gate of a thin film transistor and some other signal lines formed in the light-transmitting region TA. Wherein, the first mask includes a half-tone mask (HTM).

Optionally, a material of the first electrode layer 20 includes a transparent conductive material such as indium tin oxide (ITO), and a material of the gate metal layer 80 includes metals such as copper, titanium, molybdenum and alloys thereof.

Figure 9:
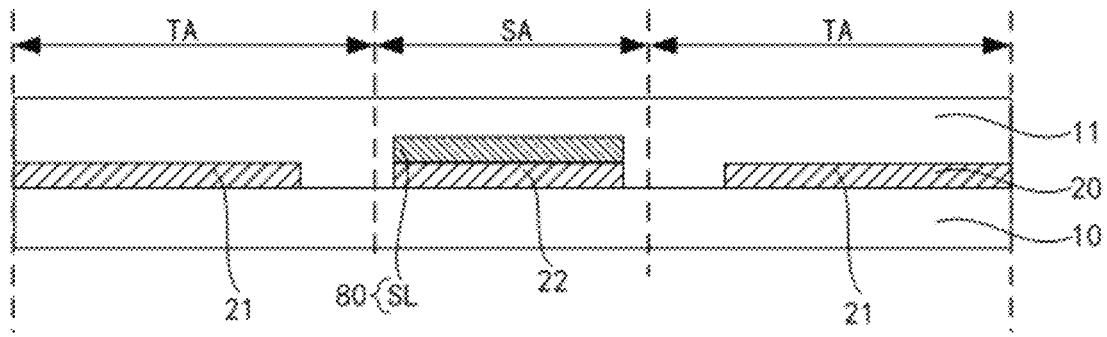

S303: covering the first electrode layer 20 and the first substrate 10 with a gate insulating layer 11;

Specifically, referring to FIG. 9, a gate insulating layer 11 is deposited on the first electrode layer 20 and the first substrate 10, and the gate insulating layer 11 covers the pixel electrode 21, the gate scanning line SL and a part of the first substrate 10. A material of the gate insulating layer 11 includes an inorganic material such as silicon oxide (SiOx), silicon nitride (SiNx), silicon oxynitride (SiNO), etc.

Figure 10:
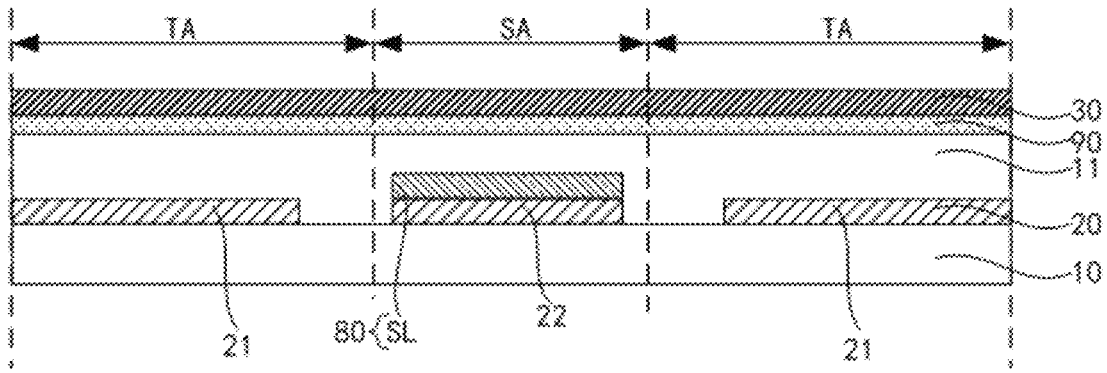
Figure 11:
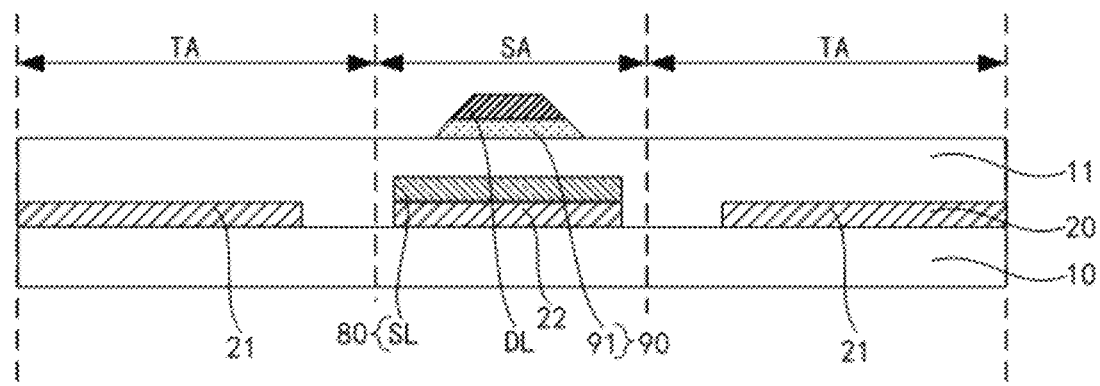

S304: forming a source-drain electrode layer 30 on the gate insulating layer 11, and the source-drain electrode layer 30 includes a data line DL formed in the light-shielding region SA;

Specifically, referring to FIG. 10 and FIG. 11. A semiconductor layer 90 and a source-drain electrode layer 30 are sequentially deposited on the gate insulating layer 11, and a photoresist process is carried out on the semiconductor layer 90 and the source-drain electrode layer 30 with a second mask. Thus, the semiconductor layer 90 includes a first semiconductor part 91 formed in the light-shielding region SA, the source-drain electrode layer 30 includes a data line DL formed in the light-shielding region SA. The data line DL is covered on the first semiconductor part 91. Wherein, the second mask includes a half-tone mask (HTM).

Of course, the semiconductor layer 90 further includes an active layer of the thin film transistor formed in the light transmission region TA. The source-drain electrode layer 30 further includes a source electrode and a drain electrode of the thin film transistor formed in the light transmission region TA. The source electrode and the drain electrode cover a part of the active layer. In this way, the semiconductor layer 90 and the source-drain electrode layer 30 are also patterned in a same photoresist process, so that one photomask is saved, thereby saving costs.

Optionally, a material of the semiconductor layer 90 includes a semiconductor material such as low temperature polysilicon and metal oxide semiconductor material, and a material of the source-drain electrode layer 30 includes metals such as copper, titanium, molybdenum and alloys thereof.

Figure 12:
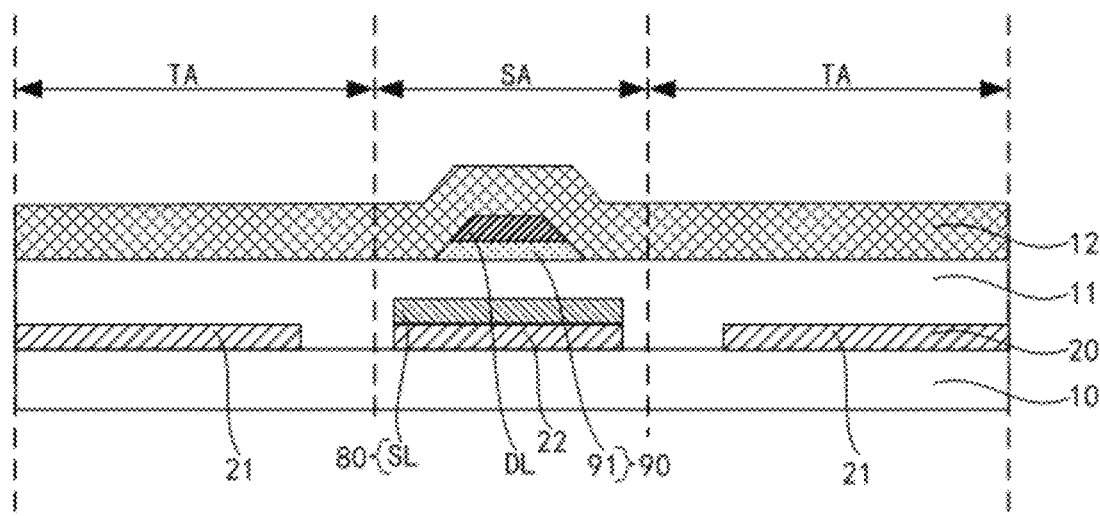
Figure 13:
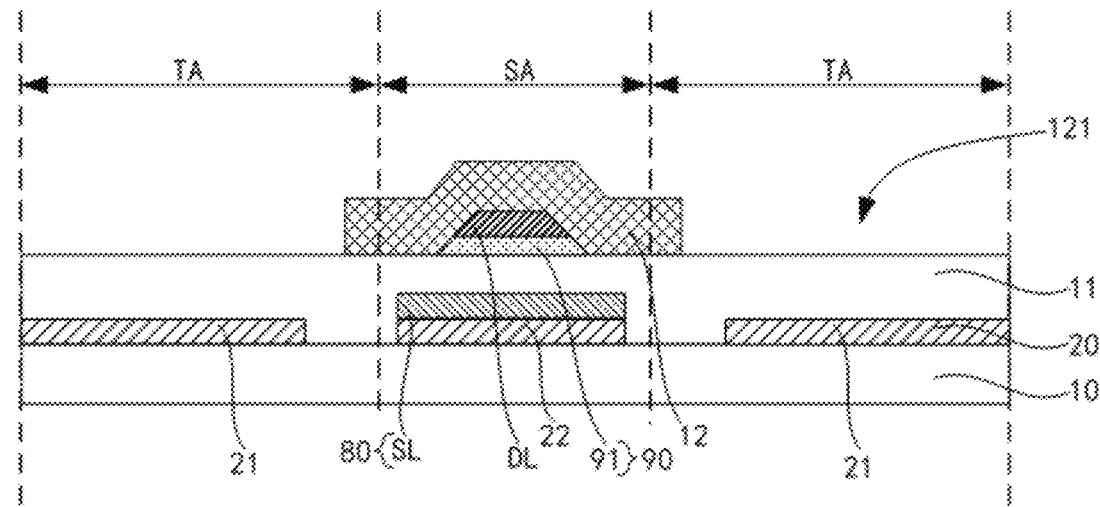

S305: covering the source-drain electrode layer 30 and the gate insulating layer 11 with a passivation layer 12, and a thickness of the passivation layer 12 in the light-transmitting region TA is less than a thickness of the passivation layer 12 in the light-shielding region SA;

Specifically, referring to FIG. 12 and FIG. 13. The passivation layer 12 is deposited on the source-drain electrode layer 30 and the gate insulating layer 11, and a photoresist process is carried out on the passivation layer 12 with a third photomask. Thus, the thickness of the passivation layer 12 in the light-transmitting region TA is less than the thickness of the passivation layer 12 in the light-shielding region SA. Specifically, the passivation layer 12 is provided with a first opening 121 in the light-transmitting region TA, and the first opening 121 goes through at least a part of the passivation layer 12. In this embodiment, the first opening 121 completely goes through the passivation layer 12, the passivation layer 12 in the light-transmitting region TA is completely removed, which is used as an example for illustration. Wherein, the third mask includes a half-tone mask (HTM).

Optionally, a material of the passivation layer 12 includes an inorganic material such as silicon oxide (SiOx), silicon nitride (SiNx), silicon oxynitride (SiNO), etc.

S306: forming a second electrode layer 40 disposed on the passivation layer 12, the second electrode layer 20 includes a light-shielding electrode 42 formed in the light-shielding region SA and a common electrode 41 formed in the light-transmitting region TA; the light-shielding electrode 42 is disposed corresponding to the data line DL, and the common electrode 41 is disposed corresponding to the pixel electrode 21.

Figure 14:
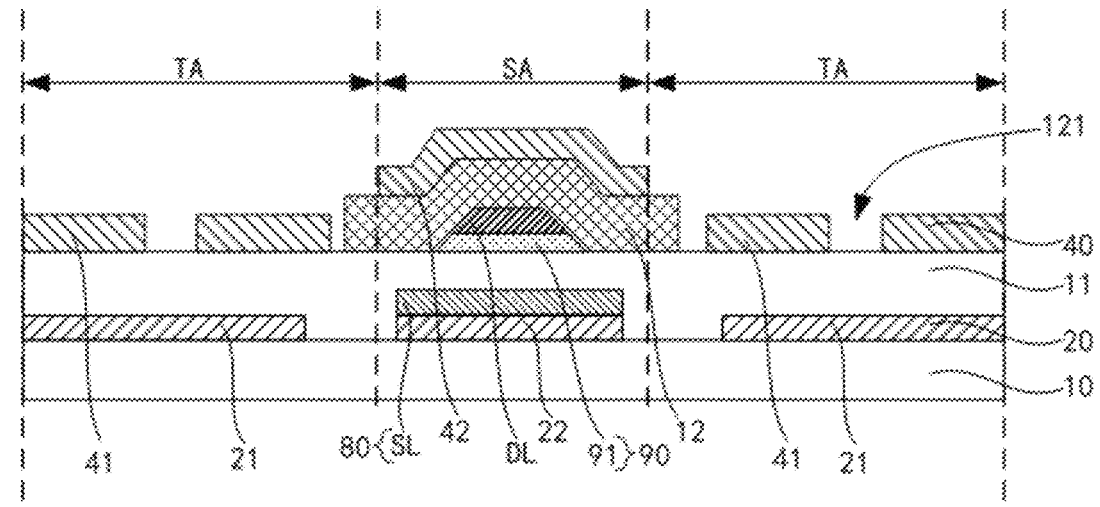

Specifically, referring to FIG. 14. The second electrode layer 40 is deposited on the passivation layer 12, the second electrode layer 40 is covered on the passivation layer 12 and the gate insulating layer 11, and a photoresist process is carried out on the second electrode layer 40 with a fourth mask. Thus, the first electrode layer 20 includes the light-shielding electrode 42 formed in the light-shielding region SA and the common electrode 41 formed in the light-transmitting region TA. The light-shielding electrode 42 is disposed corresponding to the data line DL, and the common electrode 41 is disposed corresponding to the pixel electrode 21. Optionally, a material of the second electrode layer 40 is the same as that of the first electrode layer 20.

It should be noted that, referring to FIG. 3, the manufacturing method of the display panel of the embodiment of the present application further includes: providing a second substrate 50, and forming a light-shielding layer 60 and a color filter layer 70 on the second substrate 50. The light-shielding layer 60 and the color filter layer 70 are disposed towards the second electrode layer 40. The light-shielding layer 60 is disposed corresponding to the light-shielding region SA, the light-shielding layer 60 is provided with a second opening 601 corresponding to the light-transmitting region TA, and the color film layer 70 is disposed in the second opening 601. In addition, since the light-shielding electrode 42 is disposed corresponding to light-shielding region SA, the light-shielding electrode 42 together with the light-shielding layer 60 play a role of shielding light. Thus, light leakage in the light-shielding region SA is improved, so that a width of the light-shielding layer 60 can is reduced, thereby improving aperture ratio of the display panel 100.

Based on a same idea of invention, an embodiment of the present application further provides an electronic device. The electronic device includes a house and the display panel 100 according to one of the embodiments mentioned above. The display panel 100 is disposed in the house. The electronic device includes display devices such as mobile phones, tablets, and televisions, etc.

It can be known according to above-mentioned embodiments:

The present application provides the display panel and the manufacturing method thereof, and the electronic device, the display panel includes the light-transmitting region and the light-shielding region disposed at the periphery of the light-transmitting region. The first electrode layer of the display panel is disposed on the first substrate, and includes a pixel electrode formed in the light-transmitting region. The gate insulating layer covers the first electrode layer and the first substrate. The source-drain electrode layer is disposed on the gate insulating layer, and includes the data line formed in the light-shielding region. The passivation layer covers the source-drain electrode layer and the gate insulating layer. The second electrode layer is disposed on the passivation layer, and includes the light-shielding electrode formed in the light-shielding region and the common electrode formed in the light-transmitting region. The light-shielding electrode is disposed corresponding to the data line, and the common electrode is disposed corresponding to the pixel electrode. The thickness of the passivation layer in the light-transmitting region is less than the thickness of the passivation layer in the light-shielding region, so as to reduce a thickness of an insulating layer between the pixel electrode and the common electrode. In this way, when a certain electric field is formed, a driving voltage which is required can be reduced, so as to reduce power consumption of the display panel, thereby alleviating an urgent need to reduce power consumption of display screen in prior art.

In the foregoing embodiments, description of each embodiment have their own emphases, and for parts not described in detail in a certain embodiment, reference may be made to relevant descriptions of other embodiments.

The embodiments of present application are described in detail above. This article uses specific cases for describing the principles and the embodiments of the present application, and the description of the embodiments mentioned above is only for helping to understand the method and the core idea of the present application. It should be understood by those skilled in the art, that it can perform changes in the technical solution of the embodiments mentioned above, or can perform equivalent replacements in part of technical characteristics, and the changes or replacements do not make the essence of the corresponding technical solution depart from the scope of the technical solution of each embodiment of the present application.

What is claimed is:

1. A display panel, comprising a light-transmitting region and a light-shielding region disposed at a periphery of the light-transmitting region, and further comprising:
    a first substrate;
    a first electrode layer disposed on the first substrate and comprising a pixel electrode formed in the light-transmitting region;
    a gate insulating layer covering the first electrode layer and the first substrate;
    a source-drain electrode layer disposed on the gate insulating layer and comprising a data line formed in the light-shielding region;
    a passivation layer covering the source-drain electrode layer and the gate insulating layer;
    a first opening in the light-transmitting region, wherein the first opening goes through the passivation layer and further extends into the gate insulating layer; and
    a second electrode layer comprising a light-shielding electrode formed in the light-shielding region and a common electrode formed in the light-transmitting region, the light-shielding electrode being disposed corresponding to the data line and on the passivation layer, and the common electrode being disposed in the first opening and being in direct contact with the gate insulating layer;
    wherein a thickness of the gate insulating layer disposed between the pixel electrode and the common electrode in the light-transmitting region is less than a thickness of the gate insulating layer disposed in the light-shielding region; and
    wherein the common electrode and the pixel electrode are insulated from each other by the gate insulating layer under the first opening.

2. The display panel according to claim 1, wherein an orthographic projection of the light-shielding electrode on the first substrate covers an orthographic projection of the data line on the first substrate.

3. The display panel according to claim 2, wherein the light-shielding electrode is electrically connected to the common electrode.

4. The display panel according to claim 1, further comprising a gate metal layer disposed between the first electrode layer and the source-drain electrode layer;
    wherein the gate metal layer comprises a gate scanning line formed in the light-shielding region, and the first electrode layer further comprises a first conductive part formed in the light-shielding region and covering the gate scanning line.

5. The display panel according to claim 4, further comprising a semiconductor layer disposed on the gate insulating layer;
    wherein the source-drain electrode layer is covered on the semiconductor layer, the semiconductor layer comprises a first semiconductor part formed in the light-shielding region, and the data line is covered on the first semiconductor part.

6. The display panel according to claim 5, wherein the gate scanning line extends along a first direction, the data line extends along a second direction, the gate scanning line and the data line adjacent to each other define the light-transmitting region, and the first direction differs from the second direction.

7. The display panel according to claim 1, further comprising a light-shielding layer and a color filter layer disposed on a side of the second electrode layer away from the first substrate, the light-shielding layer being provided with a second opening corresponding to the light-transmitting region, and the color filter layer being disposed in the second opening.

8. A manufacturing method of a display panel, comprising:
providing a first substrate defined with a light-transmitting region and a light-shielding region disposed at a periphery of the light-transmitting region;
forming a first electrode layer disposed on the first substrate, wherein the first electrode layer comprises a pixel electrode formed in the light-transmitting region;
covering the first electrode layer and the first substrate with a gate insulating layer;
forming a source-drain electrode layer disposed on the gate insulating layer, wherein the source-drain electrode layer comprises a data line formed in the light-shielding region;
covering the source-drain electrode layer and the gate insulating layer with a passivation layer;
forming a first opening in the light-transmitting region, wherein the first opening goes through the passivation layer and further extends into the gate insulating layer; and
forming a second electrode layer, wherein the second electrode layer comprises a light-shielding electrode formed in the light-shielding region and a common electrode formed in the light-transmitting region; the light-shielding electrode is disposed corresponding to the data line and on the passivation layer, and the common electrode is disposed in the first opening and being in direct contact with the gate insulating layer;
wherein a thickness of the gate insulating layer disposed between the pixel electrode and the common electrode in the light-transmitting region is less than a thickness of the gate insulating layer disposed in the light-shielding region; and
wherein the common electrode and the pixel electrode are insulated from each other by the gate insulating layer under the first opening.

9. An electronic device, comprising a house and a display panel disposed in the house, wherein the display panel comprises a light-transmitting region and a light-shielding region disposed at a periphery of the light-transmitting region, and the display panel further comprises:
a first substrate;
a first electrode layer disposed on the first substrate and comprising a pixel electrode formed in the light-transmitting region;
a gate insulating layer covering the first electrode layer and the first substrate;
a source-drain electrode layer disposed on the gate insulating layer and comprising a data line formed in the light-shielding region;
a passivation layer covering the source-drain electrode layer and the gate insulating layer;
a first opening in the light-transmitting region, wherein the first opening goes through the passivation layer and further extends into the gate insulating layer; and
a second electrode layer comprising a light-shielding electrode formed in the light-shielding region and a common electrode formed in the light-transmitting region, the light-shielding electrode being disposed corresponding to the data line and on the passivation layer, and the common electrode being disposed in the first opening and being in direct contact with the gate insulating layer;
wherein a thickness of the gate insulating layer disposed between the pixel electrode and the common electrode in the light-transmitting region is less than a thickness of the gate insulating layer disposed in the light-shielding region; and
wherein the common electrode and the pixel electrode are insulated from each other by the gate insulating layer under the first opening.

10. The electronic device according to claim 9, wherein an orthographic projection of the light-shielding electrode on the first substrate covers an orthographic projection of the data line on the first substrate.

11. The electronic device according to claim 10, wherein the light-shielding electrode is electrically connected to the common electrode.

12. The electronic device according to claim 9, wherein the display panel further comprises a gate metal layer disposed between the first electrode layer and the source-drain electrode layer; and
the gate metal layer comprises a gate scanning line formed in the light-shielding region, and the first electrode layer further comprises a first conductive part formed in the light-shielding region and covering the gate scanning line.

13. The electronic device according to claim 12, wherein the display panel further comprises a semiconductor layer disposed on the gate insulating layer;
wherein the source-drain electrode layer is covered on the semiconductor layer, the semiconductor layer comprises a first semiconductor part formed in the light-shielding region, and the data line is covered on the first semiconductor part.

14. The electronic device according to claim 13, wherein the gate scanning line extends along a first direction, the data line extends along a second direction, the gate scanning line and the data line adjacent to each other define the light-transmitting region, and the first direction differs from the second direction.

15. The electronic device according to claim 9, wherein the display panel further comprises a light-shielding layer and a color filter layer disposed on a side of the second electrode layer away from the first substrate, the light-shielding layer is provided with a second opening corresponding to the light-transmitting region, and the color filter layer is disposed in the second opening.

* * * * *